United States Patent
Kelly et al.

(10) Patent No.: US 12,120,966 B2
(45) Date of Patent: Oct. 15, 2024

(54) LOW FOOTPRINT RESONATOR IN FLIP CHIP GEOMETRY

(71) Applicant: Google LLC, Mountain View, CA (US)

(72) Inventors: Julian Shaw Kelly, Santa Barbara, CA (US); Evan Jeffrey, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/902,360

(22) Filed: Sep. 2, 2022

(65) Prior Publication Data

US 2023/0056318 A1 Feb. 23, 2023

Related U.S. Application Data

(62) Division of application No. 16/753,431, filed as application No. PCT/US2017/055265 on Oct. 5, 2017, now Pat. No. 11,527,696.

(51) Int. Cl.
*H10N 60/80* (2023.01)
*G06N 10/00* (2022.01)
(Continued)

(52) U.S. Cl.
CPC ........ *H10N 60/805* (2023.02); *G06N 10/00* (2019.01); *H01P 3/003* (2013.01); *H01P 5/022* (2013.01);
(Continued)

(58) Field of Classification Search
None
See application file for complete search history.

(56) References Cited

U.S. PATENT DOCUMENTS

| | | |
|---|---|---|
| 5,075,655 A | 12/1991 | Pond et al. |
| 5,087,896 A | 2/1992 | Wen et al. |
| (Continued) | | |

FOREIGN PATENT DOCUMENTS

| | | |
|---|---|---|
| CN | 103828233 | 5/2014 |
| EP | 474393 | 3/1992 |
| (Continued) | | |

OTHER PUBLICATIONS

Orlando et al. "Flux-based superconducting qubits for quantum computers" Physica C 372-376 (2002), pp. 194-200. (Year: 2002).*

(Continued)

*Primary Examiner* — Scott B Geyer
(74) *Attorney, Agent, or Firm* — Fish & Richardson P.C.

(57) ABSTRACT

A device includes a first substrate having a principal surface; a second substrate having a principal surface, in which the first substrate is bump-bonded to the second substrate such that the principal surface of the first substrate faces the principal surface of the second substrate; a circuit element having a microwave frequency resonance mode, in which a first portion of the circuit element is arranged on the principal surface of the first substrate and a second portion of the circuit element is arranged on the principal surface of the second substrate; and a first bump bond connected to the first portion of the circuit element and to the second portion of the circuit element, in which the first superconductor bump bond provides an electrical connection between the first portion and the second portion.

16 Claims, 8 Drawing Sheets

(51) Int. Cl.
  *H01P 3/00* (2006.01)
  *H01P 5/02* (2006.01)
  *H01P 11/00* (2006.01)
  *H10N 60/01* (2023.01)
  *H10N 60/12* (2023.01)
  *H10N 60/85* (2023.01)

(52) U.S. Cl.
  CPC ............ H01P 5/028 (2013.01); H01P 11/001 (2013.01); H10N 60/0912 (2023.02); H10N 60/12 (2023.02); H10N 60/85 (2023.02)

(56) References Cited

U.S. PATENT DOCUMENTS

| | | | |
|---|---|---|---|
| 5,105,171 A * | 4/1992 | Wen | H01P 5/186 333/116 |
| 5,990,768 A * | 11/1999 | Takahashi | H01P 3/084 257/664 |
| 6,130,483 A | 10/2000 | Shizuki et al. | |
| 6,426,686 B1 | 7/2002 | Douriet et al. | |
| 7,581,443 B2 * | 9/2009 | Kubena | G01C 19/5684 73/504.12 |
| 7,932,515 B2 | 4/2011 | Bunyk | |
| 8,143,082 B2 * | 3/2012 | Dungan | B81C 1/0023 257/E21.613 |
| 8,680,689 B1 | 3/2014 | Daubenspeck et al. | |
| 9,454,061 B1 | 9/2016 | Abdo et al. | |
| 9,520,356 B1 * | 12/2016 | Chiesa | H01L 23/49838 |
| 9,570,783 B1 * | 2/2017 | Lee | H01L 21/4853 |
| 9,812,429 B2 * | 11/2017 | Das | H01L 23/49816 |
| 9,812,752 B2 * | 11/2017 | Lee | H01L 28/40 |
| 9,954,263 B2 * | 4/2018 | Lee | H01P 11/00 |
| 10,002,818 B2 * | 6/2018 | Rollin | H01P 3/06 |
| 10,121,754 B2 | 11/2018 | Oliver et al. | |
| 10,134,972 B2 | 11/2018 | Oliver et al. | |
| 10,199,553 B1 | 2/2019 | Oliver et al. | |
| 10,242,968 B2 | 3/2019 | Das et al. | |
| 10,381,541 B2 | 8/2019 | Das et al. | |
| 10,396,269 B2 | 8/2019 | Oliver et al. | |
| 10,586,909 B2 | 3/2020 | Das et al. | |
| 10,658,424 B2 | 5/2020 | Oliver et al. | |
| 2001/0020879 A1 * | 9/2001 | Takahashi | H01P 1/20363 333/204 |
| 2002/0017663 A1 * | 2/2002 | Takahashi | H01P 1/20363 257/245 |
| 2003/0080649 A1 * | 5/2003 | Araki | H03H 9/02984 29/25.35 |
| 2003/0206083 A1 * | 11/2003 | Takahashi | H01P 1/20363 333/204 |
| 2004/0124943 A1 | 7/2004 | Roberson et al. | |
| 2006/0152306 A1 * | 7/2006 | Ito | H03B 5/1876 333/219.1 |
| 2007/0026567 A1 | 2/2007 | Beer et al. | |
| 2008/0238792 A1 * | 10/2008 | Heinrich | H01Q 1/38 343/767 |
| 2010/0200968 A1 | 8/2010 | Purden et al. | |
| 2011/0140801 A1 * | 6/2011 | Shimura | H01P 5/107 333/34 |
| 2013/0075904 A1 | 3/2013 | Cho et al. | |
| 2014/0264287 A1 | 9/2014 | Abraham et al. | |
| 2015/0084208 A1 | 3/2015 | Iida et al. | |
| 2016/0276729 A1 | 9/2016 | Dang et al. | |
| 2016/0364653 A1 * | 12/2016 | Chow | H01L 25/04 |
| 2017/0263578 A1 * | 9/2017 | Ishibashi | H01L 24/16 |
| 2017/0324135 A1 | 11/2017 | Blech et al. | |
| 2017/0373044 A1 * | 12/2017 | Das | H01L 21/02345 |
| 2018/0013052 A1 * | 1/2018 | Oliver | H10N 69/00 |
| 2018/0102470 A1 * | 4/2018 | Das | H01L 23/5384 |
| 2019/0095811 A1 | 3/2019 | Antonio | |
| 2019/0103541 A1 * | 4/2019 | Abraham | H01L 24/16 |
| 2019/0273197 A1 * | 9/2019 | Roberts | G06N 10/00 |
| 2023/0200263 A1 * | 6/2023 | Derakhshandeh | H01L 24/08 257/621 |

FOREIGN PATENT DOCUMENTS

| | | |
|---|---|---|
| JP | 1983031729 | 7/1983 |
| JP | 1983207686 | 12/1983 |
| JP | 1989054740 | 3/1989 |
| JP | 1997252026 | 9/1997 |
| JP | H09252026 | 9/1997 |
| WO | WO 9220108 | 11/1992 |
| WO | WO 2017/079417 | 5/2017 |
| WO | WO 2017/105429 | 6/2017 |
| WO | WO 2017/105524 | 6/2017 |
| WO | WO 2017131831 | 8/2017 |
| WO | WO 2017/152287 | 9/2017 |

OTHER PUBLICATIONS

Li et al. "Remote sensing and control of phase qubits" Appl. Phys. Letters 97, 102507 (2010), 4 pages. (Year: 2010).*
Narayana et al. "Design and testing of high-speed interconnects for superconducting multi-chip modules" Superconducting Science and Technology 25 105021 (2012), 11 pages. (Year: 2012).*
Lewis et al. "Vacuum Gap Microstrip Microwave Resonators for 2.5-D Integration in Quantum Computing" IEEE Transactions on Applied Superconductivity, vol. 27, No. 4 (2017), 4 pages. (Year: 2017).*
Office Action in European Appln. No. 17787753.7, dated Feb. 17, 2023, 7 pages.
Office Action in Chinese Appln. No. 201780095614.4, dated Mar. 31, 2023, 30 pages (with English translation).
Office Action in Japanese Appln. No. 2022-081651, dated Apr. 10, 2023, 6 pages (with English translation).
Brecht et al., "Multilayer microwave integrated quantum circuits for scalable quantum computing," Quantum Information (2016) 2(16002);4 pages.
Decision to Grant a Patent in Japanese Appln. No. 2020-519687, dated Apr. 18, 2022, 5 pages (with English translation).
Foxen et al., "Qubit compatible superconducting interconnects," 2018 Quantum Sci. Technol., 2018, 3(014005):12 pages.
Hammer et al., "Superconducting coplanar waveguide resonators for detector applications," 2007 Supercond. Sci. Technol., 2007, 20, 20:S408-S412.
International Preliminary Report on Patentability in International Application No. PCT/US2017/055265, dated Jan. 22, 2020, 9 pages.
International Search Report and Written Opinion in International Application No. PCT/US2017/055265, dated Jun. 20, 2018, 17 pages.
Jentzsch et al., "Theory and Measurements of Flip-Chip Interconnects for Frequencies up to 100 GHz," IEEE Transactions on Microwave Theory and Techniques, May 2001, 49(5): 8 pages.
Lewis et al., "Vacuum Gap Microstrip Microwave Resonators for 2.5-D Integration in Quantum Computing," IEEE Transactions on Applied Superconductivity, Jun. 2017, 27(4):1700304.
Misra et al., "Analysis of a flip-chip bonded tunable high temperature superconducting coplanar waveguide resonator using the conformal mapping technique," 2003 Supercond. Sci. Technol., 2003, 16:492-497.
Office Action in Japanese Appln. No. 2020-519687, dated Sep. 27, 2021, 4 pages (with English translation).
Ohya et al., "Room temperature deposition of sputtered TiN films for superconducting coplanar waveguide resonators," 2014Supercond. Sci. Technol., 2014, 27:015009.
Rosenberg et al., "3D Integrated Superconducting Qubits," arXiv, Jun. 2017, 6 pages.
Notice of Allowance in Japanese Appln. No. 2022-081651, mailed on Oct. 23, 2023, 5 pages (with English translation).
Office Action in Chinese Appln. No. 201780095614.4, mailed on Nov. 7, 2023, 21 pages (with English translation).
Office Action in Chinese Appln. No. 201780095614.4, mailed on Mar. 27, 2024, 28 pages (with English translation).
Office Action in European Appln. No. 17787753.7, mailed on May 27, 2024, 9 pages.

* cited by examiner

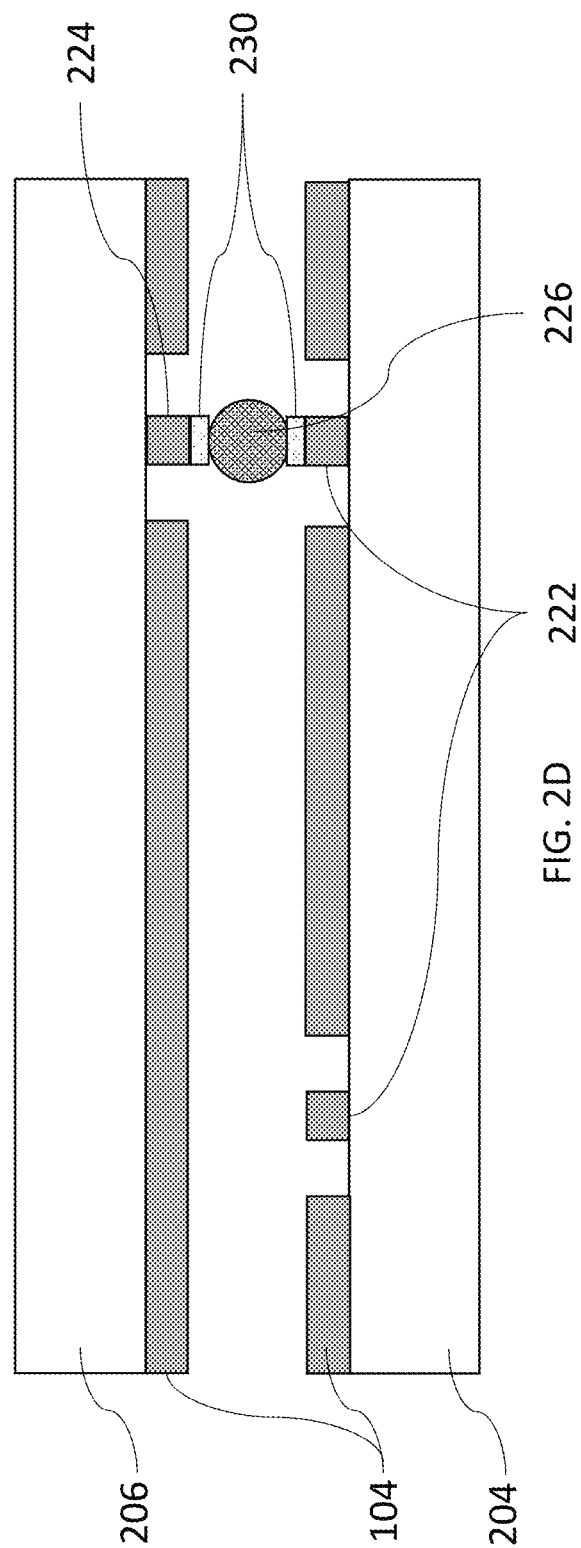

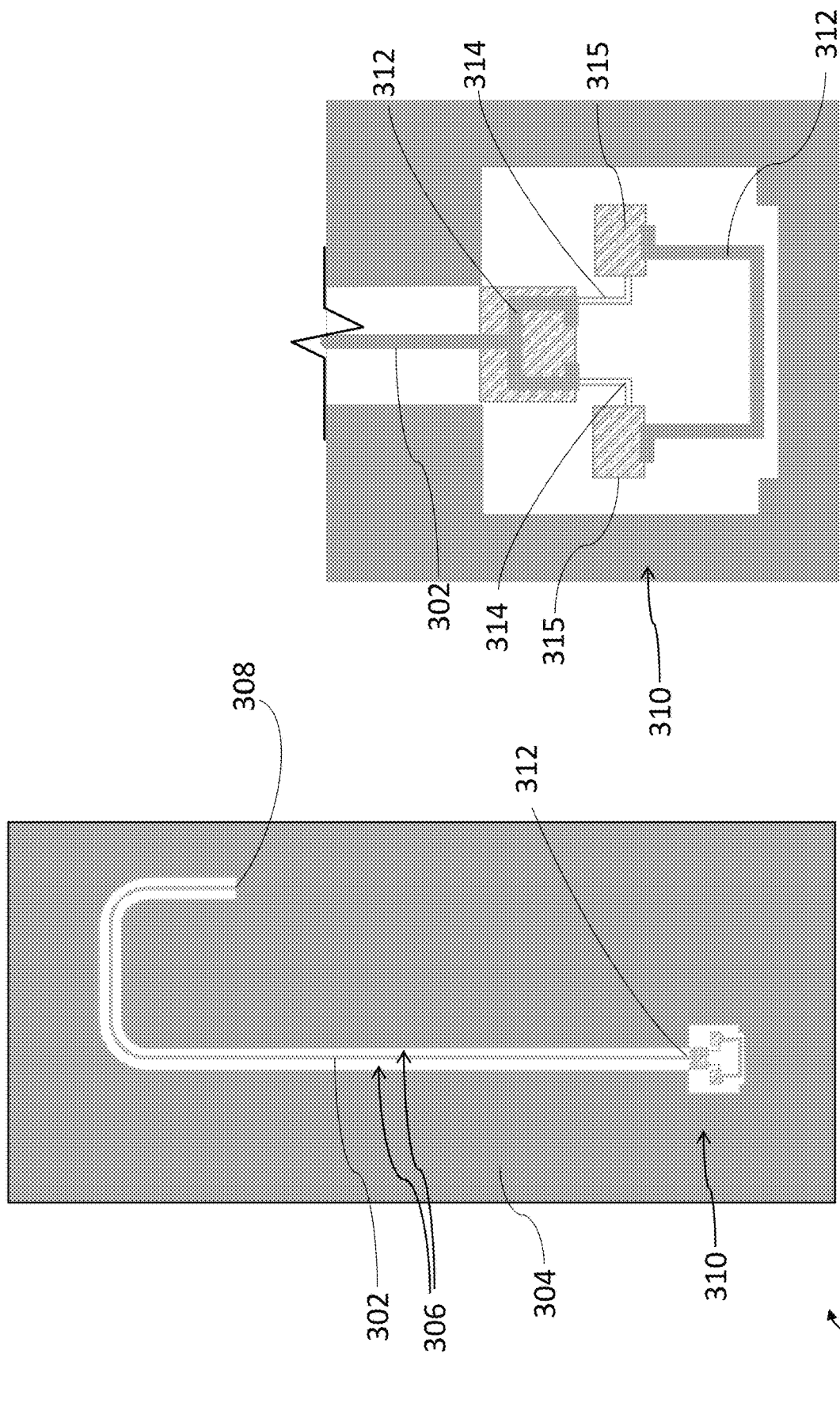

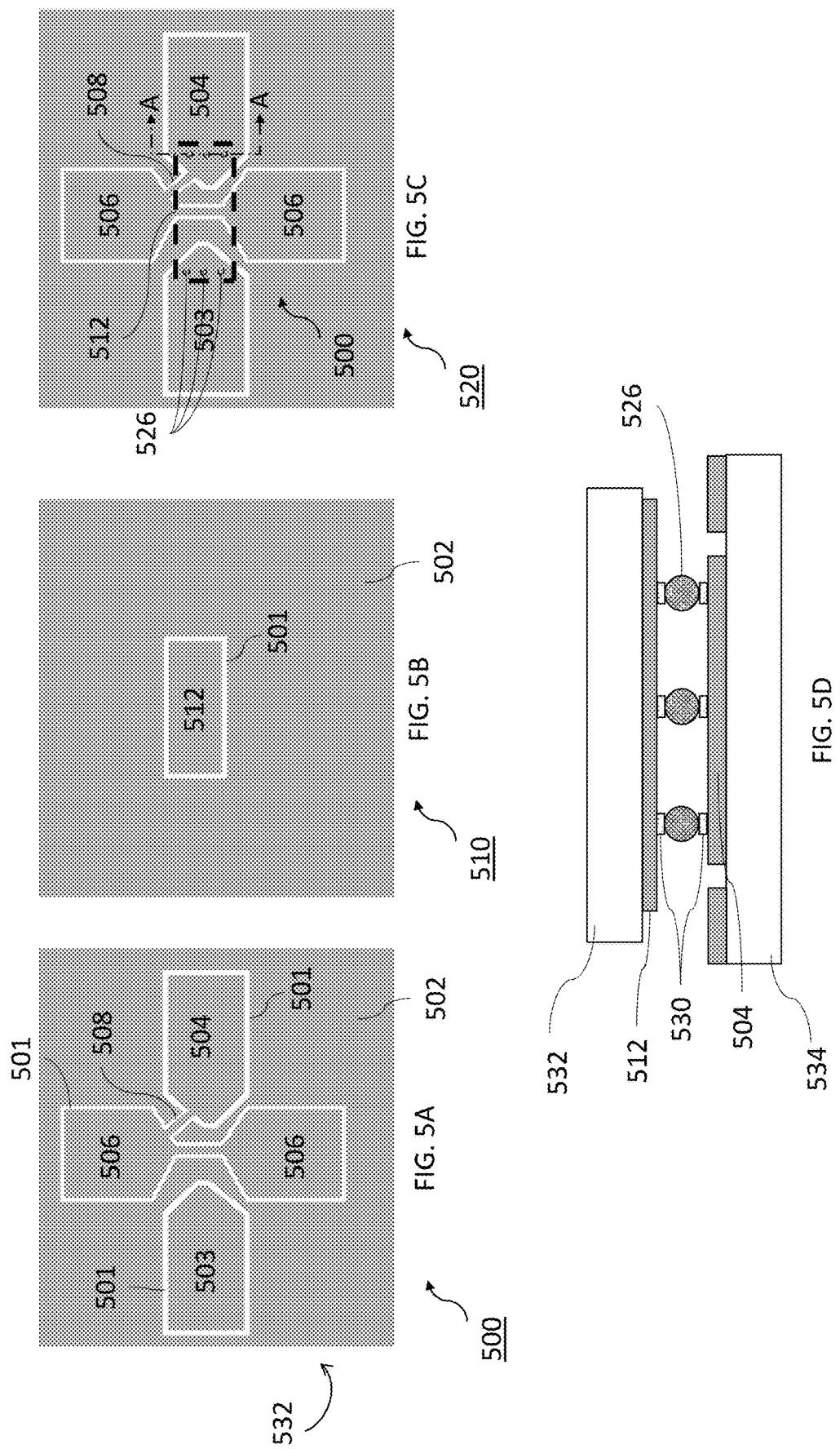

LOW FOOTPRINT RESONATOR IN FLIP CHIP GEOMETRY

CROSS-REFERENCE TO RELATED APPLICATIONS

This application is a divisional of U.S. patent application Ser. No. 16/753,431, filed Apr. 3, 2020, which is a National Stage Application under 35 U.S.C. § 371 and claims the benefit of International Application No. PCT/US2017/055265, filed Oct. 5, 2017. The disclosures of the prior applications are considered part of and are incorporated by reference in the disclosure of this application in their entirety.

TECHNICAL FIELD

The present disclosure relates to resonators in superconducting quantum computing devices.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in some aspects, the present disclosure relates to one or more devices that include: a first substrate having a principal surface; a second substrate having a principal surface, in which the first substrate is bump-bonded to the second substrate such that the principal surface of the first substrate faces the principal surface of the second substrate; a circuit element having a microwave frequency resonance mode, in which a first portion of the circuit element is arranged on the principal surface of the first substrate and a second portion of the circuit element is arranged on the principal surface of the second substrate; and a first bump bond connected to the first portion of the circuit element and to the second portion of the circuit element, in which the first superconductor bump bond provides an electrical connection between the first portion and the second portion.

Implementations of the devices can include one or more of the following features. For example, in some implementations, the microwave frequency resonance mode is in the range of 1 GHz to 20 GHz.

In some implementations, the circuit element is a quantum information processing device.

In some implementations, the quantum information processing device is a qubit.

In some implementations, the first portion of the circuit element includes a co-planar waveguide, and the second portion of the circuit element includes a superconducting quantum interference device.

In some implementations, the qubit is a co-planar waveguide flux qubit.

In some implementations, the first portion of the circuit element includes a first electrode, a first part of a second electrode, and a Josephson junction, and the second portion of the circuit element includes a second part of the second electrode In some implementations, the qubit is a transmon qubit.

In some implementations, the qubit is a co-planar waveguide flux qubit, a transmon qubit, a gmon qubit, a fluxonium qubit, a charge qubit, a quantronium qubit, or a zero-pi qubit.

In some implementations, the circuit element is a coplanar waveguide resonator.

In some implementations, the first portion of the circuit element is displaced laterally along the plane of the first substrate in relation to the second portion of the circuit element on the second substrate.

In some implementations, the first portion and the second portion includes about half of the co-planar waveguide resonator.

In some implementations, the first portion of the circuit element includes between 10% and 50% of the co-planar waveguide.

In some implementations, each of the first portion of the circuit element, the second portion of the circuit element, and the first bump bond includes a superconductor.

In some implementations, the device additionally includes a second bump bond connected to the first portion of the circuit element and to the second portion of the circuit element, in which the second bump bond provides an electrical connection the first portion and the second portions of the circuit element.

In some implementations, the superconducting bump bond includes indium, rhenium, palladium, niobium.

In another aspect, the subject matter of the present disclosure can be embodied in methods of fabricating a device that include: providing a first substrate with a principal surface, in which the first substrate includes a first portion of a circuit element having a microwave frequency resonance mode; providing a second substrate with a principal surface, in which the second substrate includes a second portion of the circuit element having the microwave frequency resonance mode; and bonding the first substrate to the second substrate with a plurality of bump bonds, in which a first bump bond of the plurality of bump bonds connects to the first portion of the circuit element to the second portion of the circuit element to provide an electrical connection between the first portion and the second portion.

Implementations of the methods can include one or more of the following features. For example, in some implementations, the circuit element is a co-planar waveguide resonator.

In some implementations, the circuit element is a qubit.

In some implementations, each of the first portion of the circuit element, the second portion of the circuit element, and the plurality of bump bonds includes a superconductor.

Various embodiments and implementations can include one or more of the following advantages. For example, in some implementations, the device geometries of the present disclosure may be more space efficient and/or may provide a smaller footprint, allowing for more densely integrated and highly connected qubit systems. In some implementations, the device geometries may provide a greater degree of freedom in designing the shape and resonance modes of resonant circuit elements.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 2D is a schematic illustrating a cross-sectional view along line A-A of the exemplary resonant structure shown in 2C.

FIG. 3A is a schematic illustrating a top view of an exemplary co-planar waveguide flux qubit.

FIG. 3B is a schematic illustrating a close-up view of an exemplary superconducting quantum interference device (SQUID) in the co-planar waveguide flux qubit of FIG. 3A.

FIG. 5A is a schematic illustrating a top view of an exemplary first portion of a transmon qubit on a first substrate.

FIG. 5B is a schematic illustrating a top view of an exemplary second portion of a transmon qubit on a second substrate.

FIG. 5C is a schematic illustrating a top view of an exemplary resonant structure formed by bonding the first substrate of FIG. 5A to the second substrate of FIG. 5B.

FIG. 5D is a schematic illustrating a cross-sectional view along line A-A of the exemplary resonant structure shown in 5C.

DETAILED DESCRIPTION

Figure 1:
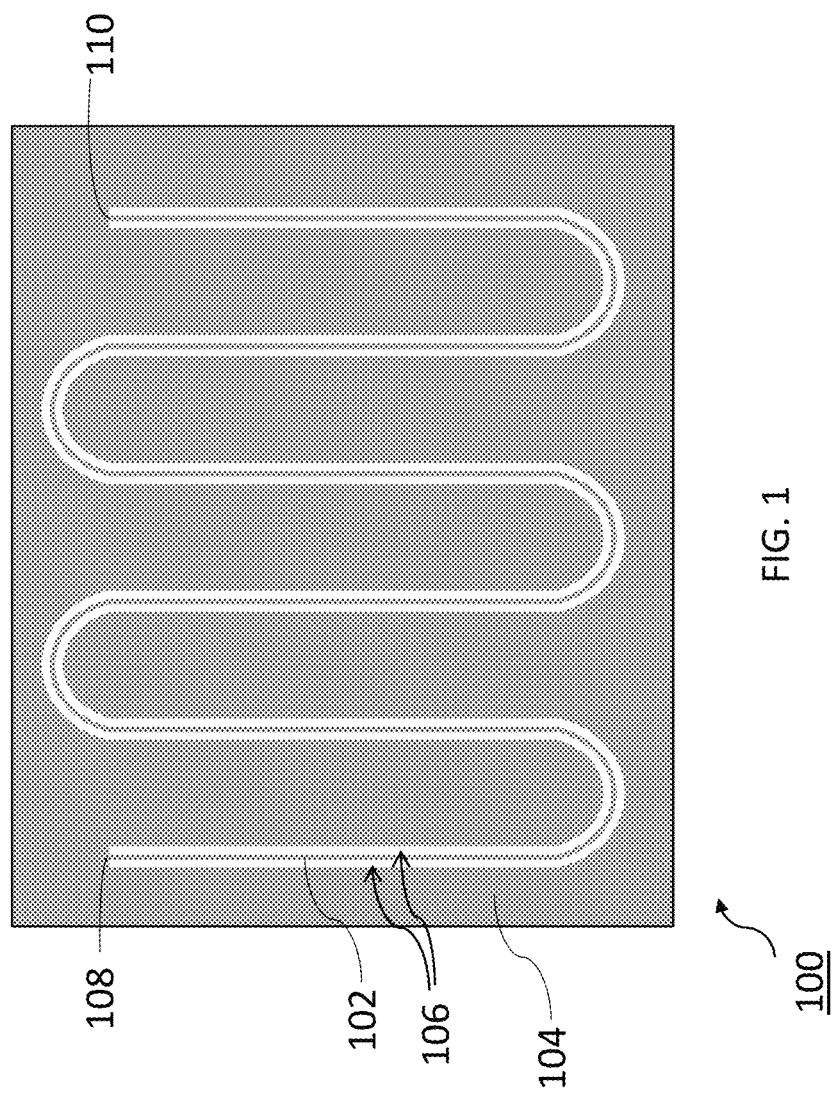
FIG. 1 is a schematic illustrating a top view of an example of a co-planar waveguide.

Quantum computing entails coherently processing quantum information stored in the qubits of a quantum computer. Quantum information processing devices, such as qubits, can be used in performing quantum processing operations. That is, the quantum information processing devices can be configured to make use of quantum-mechanical phenomena, such as superposition and entanglement, to perform operations on data in a non-deterministic manner. Certain quantum information processing devices, such as qubits, can be configured to represent and operate on information in more than one state simultaneously.

In some implementations, quantum information processing devices include circuit elements formed in part from superconducting materials such as, for example, superconducting co-planar waveguides, quantum LC oscillators, flux qubits, superconducting quantum interference devices (SQUIDS) (e.g., RF-SQUID or DC-SQUID), among others. A superconductor (or, alternatively, superconducting) material includes a material that exhibits superconducting properties at or below a corresponding superconducting critical temperature, such as aluminum (e.g., superconducting critical temperature of 1.2 Kelvin) or niobium (e.g., superconducting critical temperature of 9.3 Kelvin).

In certain types of quantum computing processors, such as quantum annealers, the qubits of the quantum processor are coupled together in a controllable manner such that the quantum state of each qubit affects the corresponding quantum states of the other qubits to which it is coupled. Depending on the processor design, the chosen architecture may limit the density and total number of qubits available for coupling, and thus limit the ability of the processor to perform complex problems requiring large numbers of qubits.

To increase qubit density and expand the number of qubits available for coupling in a quantum processor, such as a quantum annealer having superconducting quantum qubits, the processor and associated circuit elements can be constructed using 3D integration. That is, instead of fabricating the circuit elements of the processor within a single plane of a chip that extends along one and/or two dimensions (e.g., x- and/or y-directions), the circuit elements can also be formed in multiple chips that are coupled together along a third dimension (e.g., z-direction). For example, two substrates, each having some portion of a particular quantum information processing device (e.g., a qubit, a qubit measurement resonator, a qubit coupler), can be arranged in a flip-chip geometry. In this arrangement, the surfaces of the two substrates that have circuit element portions are positioned to face one another so that the portions can be brought into physical proximity and electrically coupled.

In general, in some aspects, the use of flip-chip geometries reduces the footprint (e.g., x- and/or y-directions) of the device, allowing for more densely integrated and highly connected qubit systems. In some implementations, the device geometries may also provide a greater degree of freedom in designing the shape and resonance modes of resonant circuit elements (e.g., waveguides, qubits, among other circuit elements).

Superconducting circuit elements such, as qubits and waveguides, may be structured to have frequency resonance modes in the microwave range including between 500 MHz and 100 GHz, such as, for example between 1 GHz and 20 GHz. The resonant frequency of such elements (e.g., "resonators") may be determined by the combined inductance and capacitance of its components. These resonators may be understood as having lumped element or distributed element components. Lumped element components are physically discrete, with a localized capacitance and/or inductance such that the current through the conductors connecting the components does not vary. A transmon qubit is an example of a superconductor resonator having lumped element components. Distributed element components are not discrete, but have a distributed capacitance and/or distributed inductance, e.g., the capacitance and/or inductance is distributed along the length of the components, such that current varies along the components and conductors. Such capacitance and/or inductance may therefore be defined by the dimensions of the element. A superconducting co-planar waveguide is an example of a superconductor resonator having distributed element components.

In some implementations, lumped element and distributed element resonators may be combined to form resonant circuit elements. For example, a qubit circuit element may have a number of lumped and/or distributed element components, e.g., a co-planar waveguide flux qubit. Other qubit examples with lumped and/or distributed elements include gmon qubits, fluxonium qubits, charge qubits, quantronium qubit, and zero-pi qubits.

FIG. 1 is a schematic illustrating a top view of an exemplary superconducting co-planar waveguide 100. The waveguide 100 includes a center trace 102 surrounded by and in electrical contact with a ground plane 104. Each of trace 102 and ground plane 104 is formed from a superconducting thin film material using standard thin film fabrication processes on a dielectric substrate. Trace 102 is arranged on the substrate as an elongated thin film, in which both ends 108 and 110 of the thin film are in electrical contact with the ground plane 104. The elongated sides of the trace 102 are separated from the ground-plane 104 by corresponding and co-extensive gaps 106. In the present example, the width of each respective gap 106 is constant along the length of the elongated waveguide, e.g., to avoid unnecessary reflection of the electromagnetic wave. The desired mode profile of a waveguide is the symmetric co-planar waveguide (CPW) mode, with the two ground planes on either side of the center trace 102 held to the same voltage. In some implementations, the trace 102 may have a length (measured along the elongated sides) of up to about several thousands micrometers, and a width (as measured transverse to the length) of up to about several tens of micrometers. The thickness of the deposited film forming the trace 102 (as well as the ground plane 104) may be, e.g., on the order of 100 to 200 nm. As the waveguide 100 is a distributed element resonator, the overall capacitance and inductance values of the waveguide, and thus its resonant frequency, are determined based on the thin film thickness, width, length, gap spacing to the co-planar ground plane, and substrate.

Each of trace 102 and ground-plane 104 may be formed from materials exhibiting superconducting properties at or below a superconducting critical temperature, such as aluminum (superconducting critical temperature of 1.2 kelvin) or niobium (superconducting critical temperature of 9.3 kelvin) or titanium nitride. The substrate on which the trace 102 and ground-plane 104 are formed includes a dielectric material such as, e.g., sapphire, $SiO_2$ or Si. In some implementations, sapphire provides an advantage of low dielectric loss, thus leading to higher decoherence times (e.g., longer time to significant loss of quantum mechanical properties).

The superconducting waveguide 100 may have various uses. For example, in some implementations, a terminal portion of the co-planar waveguide 100 may be electrically coupled (e.g., capacitively coupled or inductively coupled) to a qubit (not shown) and may be used to change the state of the qubit, to couple that qubit with other qubits ("qubit coupling resonator"), or to probe the qubit to determine the quantum state of the qubit ("qubit readout resonator").

In general, distributed element resonators, such as the co-planar waveguide, tend to have large footprints. It can be difficult to reduce the size of these structures. First, the physical dimensions, such as length, of the structure define the resonant frequency of the structure, and thus must be maintained to retained proper functionality. In addition, attempts to shrink the width of the waveguide tends to concentrate electric fields in the waveguide at lossy interfaces, and increases the loss of the waveguide. Loss of the waveguide can be especially problematic when, e.g., strong coupling between the co-planar waveguide and a qubit is required. For example, strong coupling allows for fast measurement when the waveguide is used as a readout resonator. However, strong coupling also means that any loss or decoherence mechanism associated with the readout resonator may also affect the qubit. Thus, any changes to the coplanar waveguide design must maintain low losses, while retaining the same resonant frequency.

Figure 2C:
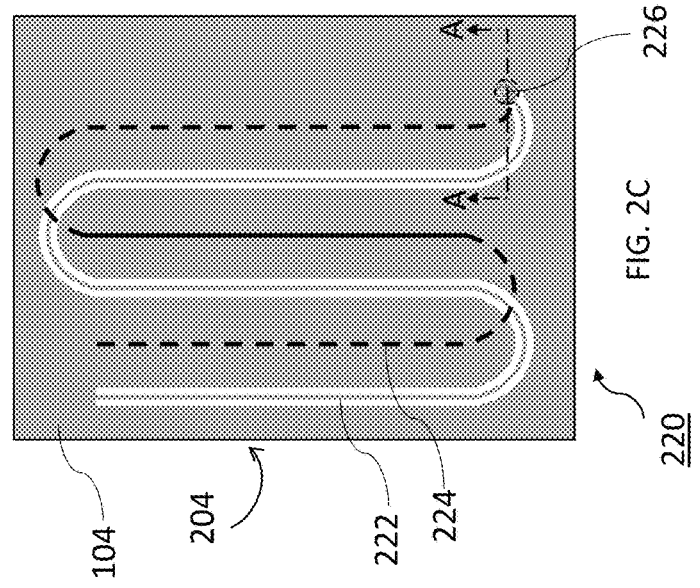
FIG. 2C is a schematic illustrating a top view of an exemplary resonant structure formed by bonding the first substrate of FIG. 2A to the second substrate of FIG. 2B.
Figure 2B:
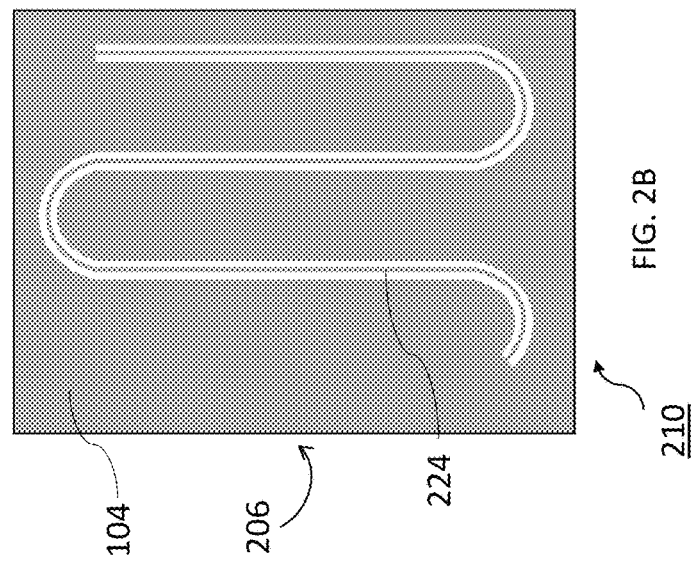
FIGS. 2A-B are schematics illustrating top views of an exemplary first portion of a co-planar waveguide and an exemplary second portion of a co-planar waveguide on a first and a second substrate, respectively.
Figure 2A:
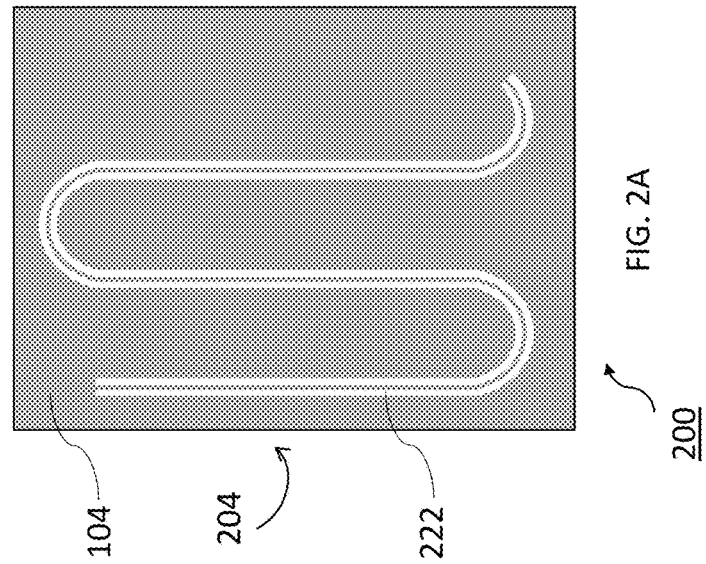

FIGS. 2A-B are schematics that illustrate top views of an exemplary resonant structure, divided across separate substrates. FIG. 2C is a schematic illustrating a top view of the exemplary resonant structure 220 formed by bonding the substrates of FIGS. 2A-2B together. This arrangement may reduce the footprint of a circuit element, such as a co-planar waveguide, and can be designed to limit losses to the system. In particular, FIG. 2A is a schematic illustrating a top view of a first portion 200 of an exemplary co-planar waveguide on a first substrate 204. FIG. 2B is a schematic illustrating a top view of a second portion 210 of the exemplary co-planar waveguide on a second substrate 206. The first portion 200 of the co-planar waveguide includes a first trace 222 surrounded by a ground plane 104 (as detailed herein, e.g., with respect to waveguide 100 in FIG. 1) formed on the first substrate 204. The second portion 210 of the co-planar waveguide includes a second trace 224 surrounded by a ground plane 104 formed on the second substrate 206. FIG. 2C illustrates a top view of a flip chip arrangement where the first substrate 204 is bonded to the second substrate 206 and the first portion 200 electrically connected to the second portion 210 through bump bonds 226. In particular, either the first portion 200 or the second portion 210 is flipped and oriented to face the waveguide-bearing surface (e.g., the "active surface" containing elements to be connected) of the other substrate. FIG. 2C shows trace 222 on substrate 204, and flipped trace 224 located in a plane above substrate 204, on substrate 206 (not shown). Trace 224 is shown as a dashed line to represent the fact that it is on a different plane from trace 222, and is being viewed through substrate 206 (not shown). In this configuration, the traces 222 and 224 can be placed in physical proximity and electrically connected, with bump bond 226, to form one continuous waveguide structure with half the waveguide structure, trace 222, on the first substrate 204 and another half of the waveguide structure, trace 224, on the second substrate 206 (not shown). The 2D footprint of the structure is smaller than if the entire waveguide structure had been located on a single substrate. In other words, by dividing portions of a waveguide across different substrates, such as in the flip chip configuration shown in FIGS. 2C-2D, space that would otherwise be occupied by portions of the waveguide may be freed up for other uses. This space may be used for qubits or circuit elements, allowing for a quantum processor having a higher number, and therefore greater density of qubits.

In some implementations, traces 222 and 224 are laterally displaced from one another along the plane of the substrate so that the trace patterns do not uniformly overlap with one another. Without being bound by any particular theory, such lateral displacement may be advantageous in preventing undesired coupling between the waveguides along their length.

The arrangement 220 does not require varying the feature size (e.g., trace length) of the co-planar waveguide. Rather, the co-planar waveguide is divided across different substrates while maintaining the same overall trace length. Thus, the desired resonant frequency of the combined waveguide 220 may be maintained while avoiding the source of any loss that may result from changing the width and/or length of the structure. Just as with waveguide 100, waveguide 220 is circuit element with a microwave frequency resonance mode and its resonant frequency is determined based on its thin film thickness, width, length, gap spacing to the co-planar ground plane, and substrate. Depending on the application, the resonant frequency of waveguide 220 may be between, e.g., 1 GHz to 20 GHz.

FIG. 2D is a schematic illustrating a cross-sectional view along line A-A of the exemplary resonant structure 220 shown in 2C. Each of first substrate 204 and second substrate 206 has a thin film ground plane 104. Furthermore, first substrate 204 and second substrate 206 have traces 222 and 224, respectively. Bump bond 226 electrically connects the first trace 222 to the second trace 224. When bump bond 226 is formed from a superconductor material, the loss associated with the electrical connection between the first portion and the second portion of the resonant structure 220 may be relatively low. By using superconducting bump bonds for coupling, it is possible to achieve a reduction in the energy loss and decoherence that can otherwise occur with lossy non-superconducting materials. Suitable superconducting materials for use as a superconducting bump bond 226 include indium, lead, rhenium, palladium, or niobium having a thin gold layer, among others. PCT Application No. PCT/US2015/068082, entitled "Superconducting Bump Bonds," filed on Dec. 30, 2015, is incorporated in its entirety by reference and provides additional detail about fabrication of such bump bonds.

When superconducting material from the traces 222 or 224 (e.g., aluminum) is placed in contact with the material of the superconducting bump bonds (e.g., indium), diffusion between indium and aluminum leads to the formation of a non-superconducting alloy that increases decoherence effects. Inter-diffusion of indium and aluminum can also lead to mechanical failures of the devices and other problems, such as voiding and pitting. To avoid the formation of alloys between the superconducting bump bond 226 and the traces 222 or 224, barrier layers 230 may be arranged between the superconducting bump bond 226 and the traces. The barrier layers 230 include a superconducting material that also serves as an electrically conducting barrier that blocks diffusion of the bump bond material into the waveguides and/or vice-versa.

The superconducting bump bond 226 can have a thickness from approximately several hundred nanometers to approximately several tens of microns or more. For example, a thickness of the bump bond 226 may be 100 nm, 250 nm, 500 nm, 750 nm, 1 micron, 2 microns, 5 microns, or 10 microns, among other thicknesses. The thickness of the bump bond can be set by a variety of factors such as the desire for greater electrical coupling, as coupling strengthens with decreasing distance between the chips. The diffusion barrier layer may be one to several nanometers in thickness, or more.

FIG. 2C shows a resonant structure 220 with portions 222 and 224 of roughly equal length. Thus, 50% of structure 220 is on substrate 204 and 50% is on substrate 206. Other apportionments are contemplated, however. In some implementations, the length ratio between the first and second portions may be: 60% on one substrate and 40% on the second substrate; or 30% and 70%; or 90% and 10%.

Although FIG. 2C shows a single bump bond 226 connection (or transition) between the two waveguide portions, multiple bump bond connections are also contemplated. Multiple, bump bonds located at approximately the same position, e.g., near the bump bond 226 location in FIG. 2C, may add redundancy to the system in case of single bump failures. Multiple bump bonds at a transition may also be used to control impedance of the connection, which depends on the geometry of the connection.

Generally, multiple bump bonds may be used to connect multiple circuit element portions. For example, similar to FIG. 2C, a first portion of a co-planar waveguide on one substrate may be connected on opposite ends to two separate co-planar waveguide portions on a second substrate, which faces the first substrate. Alternatively, one end of the first portion may be bonded to a co-planar waveguide on a second substrate (e.g., as shown in FIG. 2C), and the other end may be bonded to other circuit elements located on the second substrate (e.g., on substrate 206 in FIG. 2C).

Furthermore, multiple bump bonds between two or more waveguide portions, where the bumps are located at different positions along the waveguide portions, can be used to achieve novel waveguide modes through various waveguide geometries. These modes may provide improvement for various waveguide functions, such as cross-talk or coupling. They may also add screening to reduce crosstalk (e.g., between one portion to the other). Using a flip chip geometry and multiple bump bonds, certain waveguide portions may be positioned on the two chips so as to be physically distant from other waveguide portions of the same resonator, or other circuit elements to improve screening (e.g., reduction in interference or cross-talk). If cross-talk is desirable, waveguide portions may be positioned to be closer to other circuit elements.

In general, in some implementations, co-planar waveguides are electrically connected to and form part of another resonant circuit element such as, e.g., a distributed element component of a qubit. FIG. 3A is a schematic illustrating a top view of an exemplary co-planar waveguide flux qubit 300 (also known as a "fluxmon qubit"). FIG. 3B is a close-up view of the co-planar waveguide flux qubit 300. Qubit 300 includes a co-planar waveguide trace 302 that is coupled to a quantum device 310. The quantum device 310 can include, but is not limited to, superconducting quantum interference devices (SQUIDS). In the present example, the quantum device 310 is a DC-superconducting quantum interference device (DC-SQUID), though other SQUID devices may be used. The co-planar waveguide trace 302 and DC-SQUID 310 are surrounded by and are in electrical contact with a ground plane 304. Each of waveguide 302, DC-SQUID 310, and ground plane 304 is formed from a superconducting thin film material using standard thin film fabrication processes on a dielectric substrate. Waveguide trace 302 is arranged on the substrate as an elongated thin film, in which one end 308 of the thin film is in electrical contact with the ground plane 304 and another opposite end 312 of the thin film is in electrical contact with DC-SQUID 310. DC-SQUID 310 includes a loop 312 of superconducting material that is interrupted by two Josephson junctions 314, and contact pads 315. For example, the Josephson junctions 314 may be formed from a tri-layer of $Al/Al_2O_3/Al$ thin films. Just as in the waveguide 102 in FIG. 1, the elongated sides of the waveguide 302 are separated from the ground-plane 304 by corresponding and co-extensive gaps 306. The thickness of the deposited film forming the waveguide 302, ground plane 304, and portions of the DC-SQUID 310 may be, e.g., on the order of 100 to 200 nm.

FIG. 3B is a schematic illustrating a close-up view of DC-SQUID 310 coupled to waveguide 302. The substrate on which the waveguide 302, DC-SQUID 310 and ground-plane 304 are formed includes a dielectric material such as, e.g., sapphire, $SiO_2$ or Si. The trace 302 also serves as a resonator through which strong and long range coupling to other qubits may be achieved. Further details on the co-planar waveguide flux qubit can be found in PCT Application No. PCT/US2015/065995, entitled "Programmable Universal Quantum Annealing with Co-Planar Waveguide Flux Qubits," incorporated herein by reference in its entirety.

Co-planar waveguide flux qubit 300 is a resonant circuit element, with a resonance frequency determined primarily by the length of the co-planar waveguide, the inductance and capacitance of the Josephson junction, and the flux through the DC-SQUID 310 loop. Depending on the application, the resonant frequency of qubit 300 may be between, e.g., 1 GHz to 20 GHz.

Figure 4C:
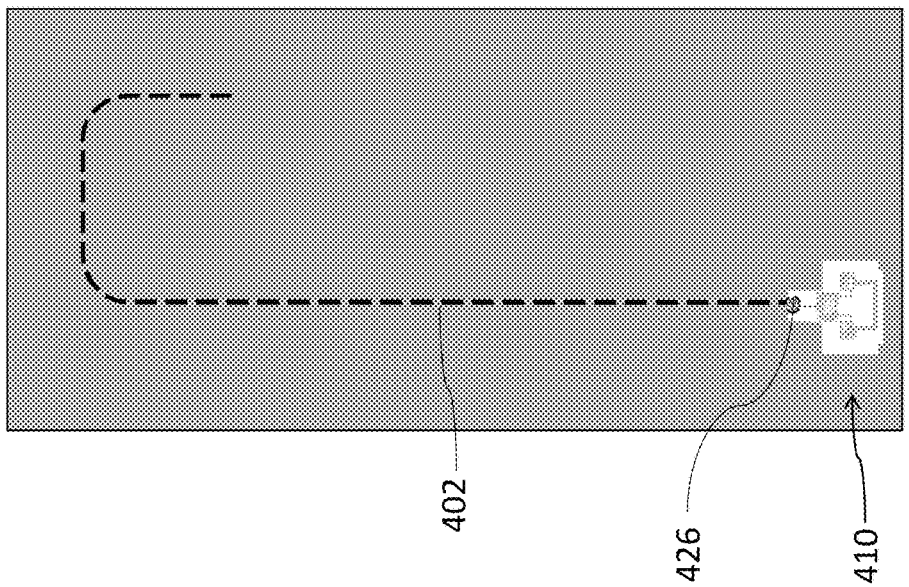
FIG. 4C is a schematic illustrating a top view of an exemplary quantum information processing device formed by electrically connecting the first portion of the device of FIG. 4A with the second portion of the device of FIG. 4B.
Figure 4B:
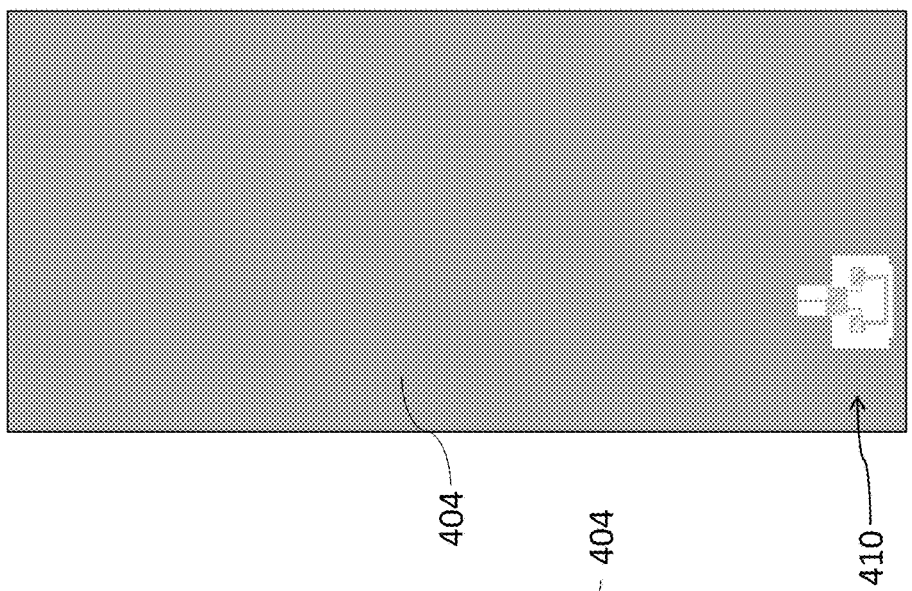
FIG. 4B is a schematic illustrating a top view of a second portion of an exemplary quantum information processing device on a second substrate.
Figure 4A:
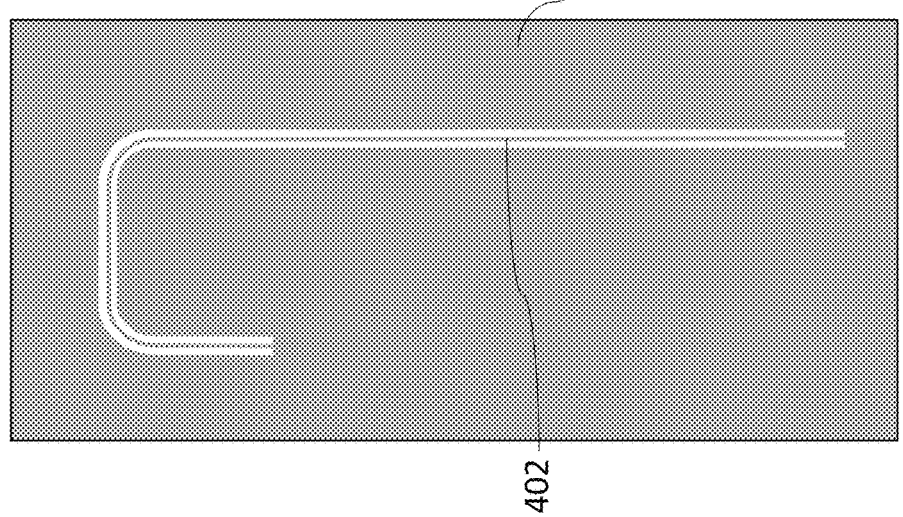
FIG. 4A is a schematic illustrating a top view of a first portion of an exemplary quantum information processing device on a first substrate.

FIG. 4A is a schematic illustrating a top view of a first portion 400 of an exemplary quantum information processing device, e.g., a co-planar waveguide flux qubit, on a first substrate. FIG. 4B is a schematic illustrating a top view of a second portion 420 of the exemplary quantum information processing device on a second substrate. FIG. 4C is a schematic illustrating a top view of the exemplary quantum information processing device 440 formed by electrically connecting the first portion 400 of FIG. 4A to the second portion 420 of FIG. 4B. The first portion 400 includes a co-planar waveguide trace 402 and the second portion 420 includes a DC-SQUID 410, as described above for FIG. 3A. Each of the co-planar waveguide trace 402 and DC-SQUID 410 are surrounded by and are in electrical contact with a ground plane 404. FIG. 4C illustrates a flip chip arrangement where the substrate supporting the first portion 400 or the substrate supporting the second portion 420 of the quantum information processing device is flipped and oriented so the active surfaces of each substrate face one another. In FIG. 4C, trace 402 is located above and approximately parallel to the substrate supporting SQUID 410. Trace 402 is shown as a dashed line to represent the fact that it is on a different plane from SQUID 410, and is being viewed through the substrate supporting trace 402 (not shown). In this configuration, waveguide trace 402 and SQUID 410 can be placed in physical proximity and electrically connected with a superconducting bump bond 426 to form fluxmon qubit 440.

Figure 4D:
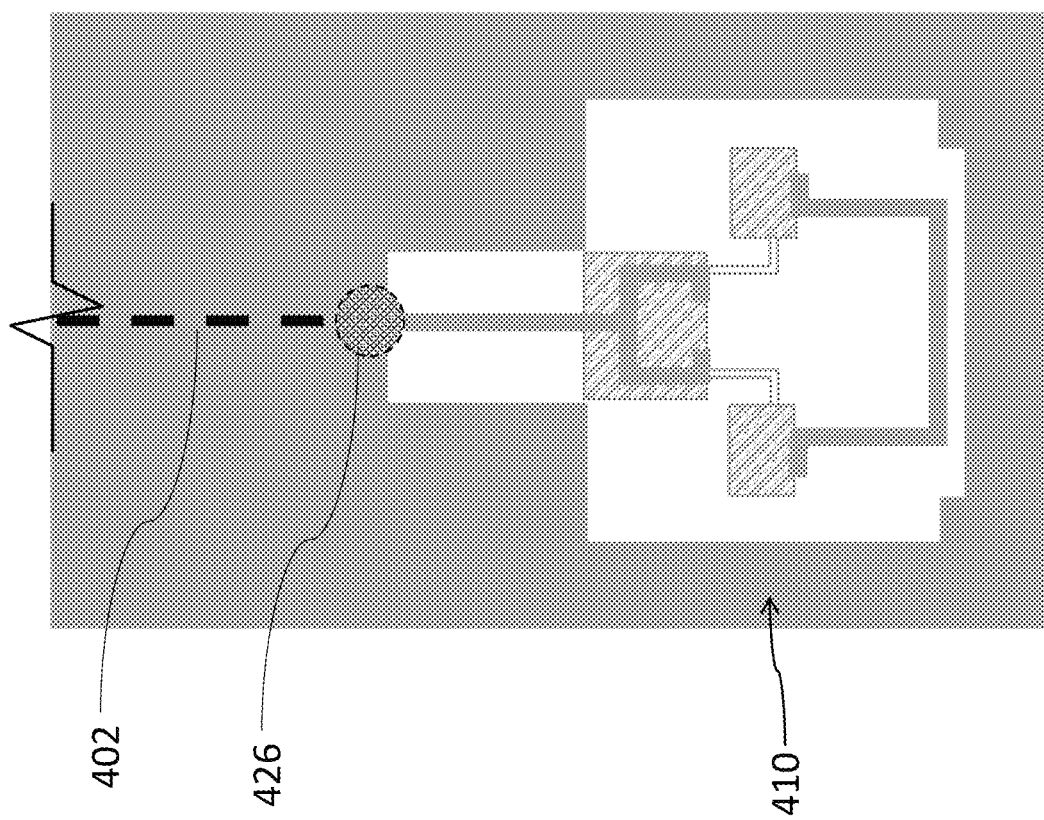
FIG. 4D is a schematic illustrating a close-up view of the SQUID of the quantum information processing device of FIG. 4C.

FIG. 4D is a close up view of the SQUID 410 coupled to the co-planar waveguide trace 402 of qubit 440 in FIG. 4C. As shown in FIG. 4C, waveguide trace 402 and SQUID 410 are located on different substrates and are coupled with a superconducting bump bond 426. By dividing portions of quantum information processing devices, such as qubits, across different substrates, such as in the flip chip configuration shown in FIGS. 4C-4D, space that would otherwise be occupied by portions of the quantum information processing device (e.g., by the waveguide trace 402 or SQUID 410 of the fluxmon qubit) may be freed up for other uses. This space may be used for arranging other qubits or circuit elements, allowing for a quantum processor having a higher number, and therefore greater density of qubits.

Similar to qubit 300, co-planar waveguide flux qubits 440 is a resonant circuit element, with a resonance frequency determined primarily by the length of the co-planar waveguide, the inductance and capacitance of the Josephson junction, and the flux through the DC-SQUID 310 loop. Depending on the application, the resonant frequency of qubit 440 may be between, e.g., 1 GHz to 20 GHz.

In general, in some implementations, multiple bump bonds may be used to electrically connect additional elements to qubit 440. For example, a bump bond at the grounded end of waveguide portion 400 in FIG. 4C may be used to connect waveguide trace 402 to circuit elements located on the substrate supporting SQUID 410. For example, trace 402 may be used to connect qubit 440 to another qubit or to a control circuit for qubit 440. Just as with waveguide resonators described above, multiple bump bonds in a flip chip geometry may generally be used to achieve novel geometries of circuit elements (e.g., via various positioning configurations of circuit element portions between chips). In addition, as described above for waveguide resonators, circuit element portions may also be positioned between the two chips to promote or reduce cross-talk and/or interference with other circuit element portions or other circuit elements.

The embodiments disclosed herein have focused on resonators with distributed element components, such as coplanar waveguide resonators and co-planar waveguide flux qubits. However, lumped element resonators, such as capacitor and inductor elements of a qubit, may also be arranged in flip chip geometries to save space and/or create novel resonance modes.

For example, a transmon qubit, which may be understood as a lumped element qubit, may have portions distributed over different substrates. FIG. 5A is a schematic illustrating a top view of an exemplary first portion 500 of a transmon qubit on a first substrate 532. First portion 500 has a thin film ground plane 502, and a number of thin film elements 503, 504, 506, and 508 surrounded by a gap 501. The ground plane 502 and elements 503, 504 and 506 include a thin film of superconducting material, such as Al, on the order of, e.g., 100 to 200 nm. One of elements 503 and 504 may be coupled to a positive voltage element (not shown), and element 506 may be coupled to a negative voltage element (not shown). Element 508 is a Josephson junction, which can be formed from two superconductors separated by a non-superconducting layer. For example, the Josephson junctions 508 may be formed from a tri-layer of $Al/Al_2O_3/Al$ thin films.

FIG. 5B is a schematic illustrating a top view of an exemplary second portion 510 of a transmon qubit on a second substrate. Portion 510 has a thin film ground plane 502, and a thin film element 512 surrounded by a gap 501.

FIG. 5C is a schematic illustrating a top view of the exemplary quantum information processing device 520 formed by electrically connecting the first portion 500 of FIG. 5A to the second portion 510 of FIG. 5B through bump bonds 526. In particular, FIG. 5C illustrates a flip chip arrangement of transmon qubit 520 where the substrate 532 supporting the first portion 500 or the substrate supporting the second portion 510 of the qubit is flipped and oriented so the active surfaces of each substrate face one another. In FIG. 5C, element 512 is located above and approximately parallel to substrate 532, supporting elements 503, 504, 506, and 508. Element 512 is shown as a dashed line to represent the fact that it is on a different plane from substrate 532, and is being viewed through the substrate supporting element 512 (not shown). In this configuration, waveguide 503 and 504 can be electrically connected by element 512, with a superconducting bump bonds 526, to form a single positive electrode in trasmon qubit 520. The use of multiple bump bonds 526 may provide redundancy in the connection in case of single bump bond failure. In this connected state, the qubit includes a capacitor formed between a positive electrode 503/504 and negative electrode 506. Josephson junction 508 is thus located between the positive and negative electrodes of the capacitor.

Without wishing to be bound by theory, one advantage of using the flip chip design in forming qubit 520 is that the positive electrode may be formed without the use of an air bridge to connect electrodes 503 and 504. An air bridge requires additional fabrication steps, one or more of which may increase the loss associated with the components (e.g., through residue left on the device surface).

FIG. 5D is a cross-sectional view along line A-A of the exemplary transmon qubit structure 520 shown in 5C. Substrates 532 and 534 are formed from a dielectric material, such as silicon or sapphire. Thin film elements 504 and 512 are located on portions 500 and 510 respectively, as described above. Superconducting bump bonds 526 with diffusion barriers 530 electrically connect the elements (as detailed in relation to the discussion of FIG. 2D above).

Generally, qubits are resonance circuit elements with a resonance frequency that may depend on the effective capacitance between the two terminals of the qubit, the inductance of the Josephson junction or SQUID, and the applied flux through the SQUID loop. Transmon qubit 520 is a resonant circuit element with a resonance frequency primarily determined by the effective capacitance between the two terminals of the qubit (506 and 503/4) and the inductance of the Josephson junction 508. Depending on the application, the resonant frequency of qubit 520 may be between, e.g., 1 GHz to 20 GHz.

Figure 6:
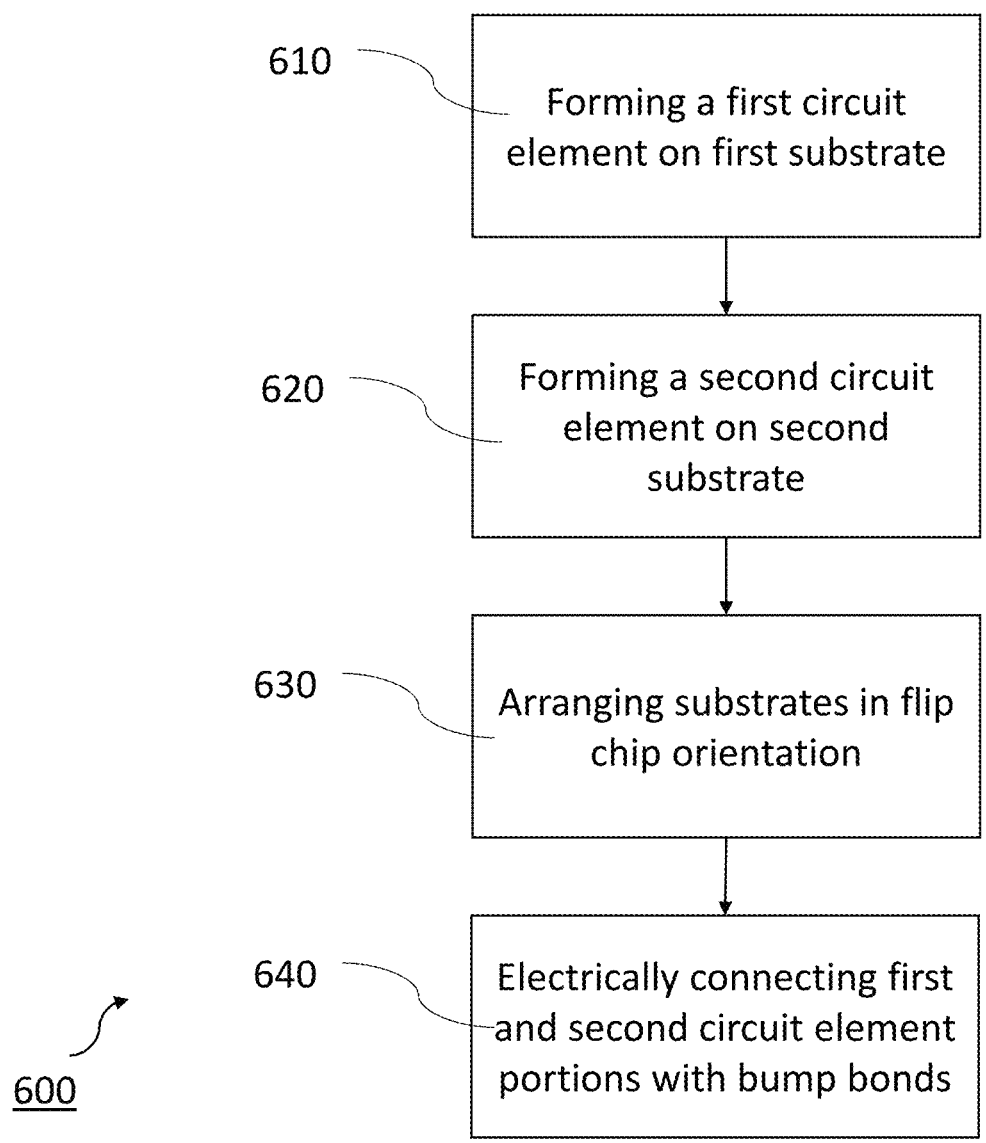
FIG. 6 is a flow chart that illustrates an exemplary process for fabricating portions of circuit elements on different substrates and connecting the different portions to form a device.

FIG. 6 is a flow chart that illustrates an exemplary process 600 for forming portions of circuit elements on different substrates and connecting the different portions with superconducting bump bonds to form a device. This process is applicable to any of the embodiments disclosed herein. In step 610, a first portion of a circuit element (e.g., a quantum information processing device such as a qubit, a qubit measurement resonator or a qubit coupler, among others) is formed on a first substrate. The first portion of the circuit element including, e.g., ground planes, can be formed on the substrate through e-beam deposition, vapor deposition, sputtering, or any other thin film deposition method. The material deposited may include, e.g., a superconductor material, such as aluminum, niobium, and/or titanium nitride. Gaps between regions of the first portion of the circuit element and/or between ground planes may be formed through a combination of photolithography and liftoff or etching techniques. In step 620, a second portion of the circuit element is similarly formed on a second substrate. Typically, a diffusion barrier layer is deposited, e.g., via reactive sputtering, on the areas of the circuit element portions to be connected. Diffusion barriers may be deposited on the circuit element portions in steps 610 and 620.

In step 630, the substrates, formed from a dielectric material, such as silicon or sapphire, are arranged in a flip chip orientation. In other words, the active surfaces of the substrates, e.g., those bearing the circuit element portions, are oriented to face one another. The surfaces are thus oriented such that the circuit element portions are in physical proximity, but located on different planes. In step 640, the portions of the circuit element are electrically connected with superconducting bump bonds to form a single resonant circuit element. The superconducting material that will form the bump bonds is then deposited, e.g., via thermal evaporation deposition, on the barrier layers. Finally, the two substrates are brought together and joined to one another at the locations of the bump bond material (e.g., using a bump bonder) to produce a stacked device with electrically coupled bump bond regions, as depicted, for example, in FIG. 5D.

Embodiments of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as quantum computing circuit elements and quantum information processing devices) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

Fabrication of the quantum circuit elements and classical circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin), niobium (superconducting critical temperature of 9.3 kelvin), and titanium nitride (superconducting critical temperature of 5.6 kelvin).

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the embodiments described above should not be understood as requiring such separation in all embodiments.

Particular embodiments of the subject matter have been described. Other embodiments are within the scope of the following claims.

What is claimed is:

1. A method of fabricating a device, comprising:
providing a first substrate with a principal surface, wherein the first substrate comprises a first portion of a circuit element having a microwave frequency resonance mode;
providing a second substrate with a principal surface, wherein the second substrate comprises a second portion of the circuit element having the microwave frequency resonance mode; and
bonding the first substrate to the second substrate with a plurality of bump bonds, wherein a first bump bond of the plurality of bump bonds connects the first portion of the circuit element to the second portion of the circuit element to provide an electrical connection between the first portion and the second portion, wherein the circuit element is a qubit.

2. The method of claim 1, wherein each of the first portion of the circuit element, the second portion of the circuit element, and the plurality of bump bonds comprises a superconductor.

3. The method of claim 1, wherein the first portion of the circuit element comprises a co-planar waveguide, and the second portion of the circuit element comprises a superconducting quantum interference device.

4. The method of claim 3, wherein the circuit element is a co-planar waveguide flux qubit.

5. The method of claim 1, wherein the first portion of the circuit element comprises a first electrode, a first part of a second electrode, and a Josephson junction, and the second portion of the circuit element comprises a second part of the second electrode.

6. The method of claim 5, wherein the circuit element is a transmon qubit.

7. The method of claim 1, wherein the first portion of the circuit element is displaced laterally along the plane of the first substrate in relation to the second portion of the circuit element on the second substrate.

8. The method of claim 1, wherein each of the first portion of the circuit element and the second portion of the circuit element comprises about half of a co-planar waveguide resonator.

9. The method of claim 1, wherein the first portion of the circuit element comprises between 10% and 50% of circuit element.

10. The method of claim 1, wherein the first bump bond comprises one or more of: indium, rhenium, palladium, niobium.

11. The method of claim 1, wherein the plurality of bump bonds comprises a second bump bond connected to the first portion of the circuit element and to the second portion of the circuit element, wherein the second bump bond provides an electrical connection to the first portion of the circuit element and to the second portion of the circuit element.

12. A method of fabricating a device, comprising:
providing a first substrate with a principal surface, wherein the first substrate comprises a first portion of a circuit element having a microwave frequency resonance mode;
providing a second substrate with a principal surface, wherein the second substrate comprises a second portion of the circuit element having the microwave frequency resonance mode; and
bonding the first substrate to the second substrate with a plurality of bump bonds, wherein a first bump bond of the plurality of bump bonds connects the first portion of the circuit element to the second portion of the circuit element to provide an electrical connection between the first portion and the second portion,
wherein the first portion of the circuit element comprises a co-planar waveguide, and the second portion of the circuit element comprises a superconducting quantum interference device.

13. A method of fabricating a device, comprising:
providing a first substrate with a principal surface, wherein the first substrate comprises a first portion of a circuit element having a microwave frequency resonance mode;

providing a second substrate with a principal surface, wherein the second substrate comprises a second portion of the circuit element having the microwave frequency resonance mode; and bonding the first substrate to the second substrate with a plurality of bump bonds, wherein a first bump bond of the plurality of bump bonds connects the first portion of the circuit element to the second portion of the circuit element to provide an electrical connection between the first portion and the second portion, wherein the first portion of the circuit element comprises a first electrode, a first part of a second electrode, and a Josephson junction, and the second portion of the circuit element comprises a second part of the second electrode.

14. A method of fabricating a device, comprising:

providing a first substrate with a principal surface, wherein the first substrate comprises a first portion of a circuit element having a microwave frequency resonance mode;

providing a second substrate with a principal surface, wherein the second substrate comprises a second portion of the circuit element having the microwave frequency resonance mode; and bonding the first substrate to the second substrate with a plurality of bump bonds, wherein a first bump bond of the plurality of bump bonds connects the first portion of the circuit element to the second portion of the circuit element to provide an electrical connection between the first portion and the second portion, wherein the first portion of the circuit element is displaced laterally along the plane of the first substrate in relation to the second portion of the circuit element on the second substrate.

15. A method of fabricating a device, comprising:

providing a first substrate with a principal surface, wherein the first substrate comprises a first portion of a circuit element having a microwave frequency resonance mode;

providing a second substrate with a principal surface, wherein the second substrate comprises a second portion of the circuit element having the microwave frequency resonance mode; and bonding the first substrate to the second substrate with a plurality of bump bonds, wherein a first bump bond of the plurality of bump bonds connects the first portion of the circuit element to the second portion of the circuit element to provide an electrical connection between the first portion and the second portion, wherein each of the first portion of the circuit element and the second portion of the circuit element comprises about half of a co-planar waveguide resonator.

16. A method of fabricating a device, comprising:

providing a first substrate with a principal surface, wherein the first substrate comprises a first portion of a circuit element having a microwave frequency resonance mode;

providing a second substrate with a principal surface, wherein the second substrate comprises a second portion of the circuit element having the microwave frequency resonance mode; and bonding the first substrate to the second substrate with a plurality of bump bonds, wherein a first bump bond of the plurality of bump bonds connects the first portion of the circuit element to the second portion of the circuit element to provide an electrical connection between the first portion and the second portion, wherein the first portion of the circuit element comprises between 10% and 50% of circuit element.

* * * * *